United States Patent
De Steur et al.

(12) 
(10) Patent No.: US 6,713,719 B1
(45) Date of Patent: Mar. 30, 2004

(54) METHOD AND DEVICE FOR LASER DRILLING LAMINATES

(75) Inventors: Hubert De Steur, Drongen (BE); Marcel Heerman, Merelbeke (BE); Jozef Van Puymbroeck, Oostkamp (BE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/089,301

(22) PCT Filed: Sep. 29, 2000

(86) PCT No.: PCT/DE00/03424

§ 371 (c)(1),
(2), (4) Date: Mar. 29, 2002

(87) PCT Pub. No.: WO01/26435

PCT Pub. Date: Apr. 12, 2001

(30) Foreign Application Priority Data

Sep. 30, 1999 (DE) .......................................... 199 47 027

(51) Int. Cl.$^7$ .............................................. B23K 26/00
(52) U.S. Cl. ................................ 219/121.71; 219/121.7
(58) Field of Search ........................ 219/121.71, 121.7, 219/121.67, 121.68, 121.69, 121.85

(56) References Cited

U.S. PATENT DOCUMENTS

| 4,839,497 A | | 6/1989 | Sankar et al. | |
| 5,593,606 A | | 1/1997 | Owen et al. | |
| 5,841,099 A | * | 11/1998 | Owen et al. | ............ 219/121.69 |
| 5,868,950 A | | 2/1999 | Noddin | |

FOREIGN PATENT DOCUMENTS

| DE | 197 19 700 A1 | 11/1998 |
| DE | 198 24 225 A1 | 2/1999 |
| EP | 0 164 564 A1 | 12/1985 |
| GB | 2 338 201 A | 12/1999 |
| WO | WO 98/02945 | 1/1998 |

OTHER PUBLICATIONS

T. Rick Fletcher: "Efficient Ablation of an Organic Polymer by a Laser Driven Shock Wave", *Journal of Applied Physics*, Bd. 73, Nr. 10, 15, pp. 5292–5294, May 1993.

M.I. Makropoulou et al.: "Vis and UV Laser Ablation of Polymers", Second GR–I International Conference on New Laser Technologies and Application, Greece, Bd. 3423, pp. 384–388, Jun. 1997.

"Wirestripping Procedure Using Visible Laser Radiation and Dye–Doped Insulation", IBM Technical Disclosure Bulletin, Bd. 34, Nr. 12, p. 378, May 1992.

F.J. Hillebrand: "Laserbohren in organischem Leiterplatten-Materia", *Feinwerktechnik & Messtechnik*, vol. 91, No. 2, pp. 56–58, Mar. 1983.

* cited by examiner

*Primary Examiner*—M. Alexandra Elve
*Assistant Examiner*—E Hardy
(74) *Attorney, Agent, or Firm*—Harness, Dickey & Pierce, P.L.C.

(57) ABSTRACT

A method and device for the laser drilling of laminates includes the use of a frequency-doubled Nd vanadate laser. The laser includes the following parameters: pulse width<40 ns, pulse frequency≧30 kHz for the metal layer and ≧20 kHz for the dielectric layer, and wavelength=532 nmn. Such a laser is used for the laser drilling of laminates which have at least one metal layer and at least one dielectric layer including an organic material.

28 Claims, No Drawings

METHOD AND DEVICE FOR LASER DRILLING LAMINATES

This application is the national phase under 35 U.S.C. §371 of PCT International Application No. PCT/DE00/03424 which has an International filing date of Sep. 29, 2000, which designated the United States of America, the entire contents of which are hereby incorporated by reference.

FIELD OF THE INVENTION

The invention generally relates to laser drilling.

BACKGROUND OF THE INVENTION

It is known from EP-A-0 164 564 to produce blind bores in a laminate comprising the layer sequence metal-dielectric-metal with the aid of an excimer laser. The top metal layer of the laminate is in this case used as a perforated mask, the pattern of perforations in which is transferred photographically and is produced by subsequent etching. The dielectric which is uncovered in the region of the hole of this mask is then removed by the action of the excimer laser until the bottom metal layer is reached and the process of removing material is terminated. The known method is used in particular to produce the required through-contact holes in the form of blind bores during the fabrication of multilayer circuit boards.

German journal "Feinwerktechnik & Messtechnik 91 (1983) 2, pp. 56–58 has disclosed a similar method for the fabrication of multilayer circuit boards in which the blind bores which are used as through-contacts are produced with the aid of a $CO_2$ laser. In this case too, the top copper foil is used as a perforated mask, in which the copper is etched away wherever the laser beam is to produce a hole.

DE-A-197 19 700 has also already disclosed devices for the laser drilling of laminates in which a first laser, having a wavelength in the range from approximately 266 nm to 1064 nm, is used to drill the metal layers and a second laser, having a wavelength in the range from approximately 1064 nm to 10600 nm, is used to drill the dielectric layers.

U.S. Pat. No. 5,593,606 has disclosed a method for the laser drilling of laminates in which a single UV laser, the wavelengths of which are below 400 nm and the pulse widths of which are below 100 ns, is used to drill the metal layers and to drill the dielectric layers. Therefore, on the condition that an excimer laser is not used, metal and organic material are drilled using the same UV laser.

DE-A-198 24 225 has disclosed a further method for the laser drilling of laminates, in which, by way of example, an SHG (second harmonic generation) YAG laser with a wavelength of 532 nm or a THG (third harmonic generation) YAG laser with a wavelength of 355 nm can be used to drill the metal layers and to drill the dielectric layers.

It can fundamentally be stated that, when UV lasers, i.e. lasers with wavelengths of below 400 nm, are used for the laser drilling of organic materials, photochemical decomposition of the organic materials takes place. Therefore, there is no burning and, on account of the at most extremely low thermal load, there is no delamination when used for laminates. By contrast, when $CO_2$ lasers are used for the laser drilling of organic materials, thermal decomposition of the organic materials does occur, i.e. burning may occur and there is a risk of delamination in the case of laminates. However, compared to UV lasers, $CO_2$ lasers can achieve considerably shorter processing times when drilling organic materials.

SUMMARY OF THE INVENTION

An embodiment of the invention is based on the problem of allowing rapid production of blind bores or through-holes during the laser drilling of laminates which have at least one metal layer and at least one dielectric layer comprising an organic material without the laminates being damaged.

An embodiment of the invention is based on the discovery that frequency-doubled Nd vanadate lasers with a wavelength of 532 nm at short pulse widths of less than 40 ns can be used to effectively process both the metal layers and the dielectric layers.

In one case, pulse frequencies of $\geq 30$ kHz can be selected for the laser drilling of the metal layers, while pulse frequencies of $\geq 20$ kHz can be selected for the laser drilling of the dielectric layers. The selection of relatively high pulse frequencies for the processing of the organic materials results in particularly effective laser processing of both types of material. The laser processing of the organic materials results in a combination of photochemical and thermal decomposition which, compared to UV lasers, allows shorter processing times to be achieved and, compared to $CO_2$ lasers, avoids excessively high thermal loads.

The frequency-doubled Nd vanadate laser which is selected according to an embodiment of the invention for the drilling of laminates allows very high pulse frequencies, which may even be over 100 kHz, at low pulse widths of less than 40 ns. The high pulse frequencies allow rapid and effective processing of the laminates, while the low pulse widths ensure that the thermal load is very low. This combinastion of high pulse frequencies and short pulse widths cannot be achieved with other lasers which operate with similar or identical wavelengths. For example, in the case of the SHG YAG laser which is known from DE-A-198 24 225, at relatively high pulse frequencies it is at best possible to achieve pulse widths of 70 to 80 ns.

One configuration, through the use of pulse widths of less than 30 ns, allows the thermal load on the laminates during laser drilling to be reduced still further.

When using a focused laser beam with a spot diameter of between 10 $\mu$m and 100 $\mu$m, the laser processing of metal and organic material is effective. When using spot diameters of between 20 $\mu$m and 50 $\mu$m the laser processing of the two materials can be made even more effective.

On account of the higher absorption of the laser beams in the organic material, one configuration allows the processing rate to be increased considerably. The additives should have a significantly higher absorptance for laser beams with a wavelength of 532 nm than the pure organic material.

One refinement allows a particularly simple and economic increase in the absorptance of the organic material to be achieved.

One configuration, on account of the choice of red additives, allows the absorptance to be optimized, since the green light of wavelength 532 nm is absorbed particularly well by the complementary color red.

One refinement provides, for the admixing of pigments as additive, a quantitative range which has proven particularly successful at increasing the absorptance without impairing the other properties. A narrower quantitative range can be regarded as optimal.

If the absorptance of the organic material is increased to at least 50% by the admixing of additives, the processing rate in the organic material has already been increased considerably. If the absorptance is increased to at least 60%, or to at least 80%, the processing times for the laser drilling of the organic material can be reduced further to a corresponding degree.

DETAILED DESCRIPTION OF THE PREFERRED EMBODIMENTS

The following types of laser were used in the examples described below:

Laser I:

Diode-pumped, frequency-doubled Nd vanadate laser produced by Spectra Physics, Mountain View, Calif., U.S.

Designation: T80-YHP40-532QW
Wavelength: 532 nm
Power: approx. 8.5 W
Operating mode: Monomode TEMoo
Pulse width: 20 ns at pulse frequency 10 kHz
Pulse frequency: up to 200 kHz
Field size: 100×100 mm².

Laser II:

Diode-pumped, frequency-doubled Nd vanadate laser produced by Haas-Laser GmbH, Schramberg, Del.

Designation: None, since it is a prototype
Wavelength: 532 nm
Power: approx. 4.0 W
Operating mode: Monomode TEMoo
Pulse width: 25 ns at pulse frequency 10 kHz
Pulse frequency: up to 200 kHz
Field size: 100×100 mm².

The following materials were processed using lasers I and II:

Material I:

An RCC material (RCC=Resin Coated Copper Foil) is laminated onto a glass fiber-reinforced FR4 material (FR4= level 4 fire retardant epoxy-glass composition) which was coated on both sides with copper foil. The result is a layer sequence comprising a 12 $\mu$m thick copper foil, a 60 $\mu$m thick layer of unreinforced epoxy material, a 16 $\mu$m thick copper foil, a 1 mm thick layer of glass fiber-reinforced epoxy material and a 16 $\mu$m thick copper foil.

Material II:

12 $\mu$m thick copper foils were laminated onto both sides of a 60 $\mu$m thick FR4 material.

The following additives were available to modify the materials I and II described above:

Additive I:

Organic red pigment bearing the designation "1501 Fast Red" (C.I. Pigment Red 48:1) produced by Xijinming Shenzhou City, Hebei Province, P.R. China This is an azo pigment based on a barium salt.

Additive II:

Inorganic red pigment known as "Bayferrox™" (C.I. Pigment Red 101) produced by Bayer AG, DE. This is an iron oxide red pigment.

Additive III:

Polymer-soluble anthraquinone dye known as "Oracet™ Yellow GHS" (C.I. Solvent Yellow 163) produced by CIBA-Geigy AG, CH.

Additive IV:

Fibers of a ruby glass which has been produced by adding 2% by weight of selenium, 1% by weight of cadmium sulfide, 1% by weight of arsenic trioxide and 0.5% by weight of carbon to a base glass of the composition $Na_2O$—ZnO—$4SiO_2$.

EXAMPLE 1

The laser I was used to introduce blind bores with a diameter of 125 $\mu$m into the upper, 12 $\mu$m thick copper foil and the 60 $\mu$m thick dielectric layer comprising unreinforced epoxy material of the material I. The pulse frequency was 45 kHz for the drilling of the copper layer and 25 kHz for the drilling of the dielectric layer. The pulse length was 30 ns.

Using two galvanometer mirrors to divert the laser beam in the x-direction and in the y-direction, an area of 10 cm×10 cm was processed. With a spot diameter of the focused laser beam of approx. 25 $\mu$m, the laser beam was moved in a small number of concentric circles in the outer region of the hole in order to drill through copper, the inner region of the copper foil then being expelled automatically. The diameter of the outer concentric circle was 110 $\mu$m. The linear velocity of the laser beam was 900 mm/s. To drill the epoxy material, the laser beam was set at 1.6 mm out of focus (OOF), but in this case too concentric circles were described. After the epoxy material had been drilled through, the copper foil below it was only slightly attacked.

The drilling of the copper foil took place at a rate of 289 holes per second, while the drilling of the epoxy material took place at a rate of 220 holes per second. The introduction of the blind bores into the laminate therefore took place at a speed of 120 holes per second.

EXAMPLE 2

The difference from Example 1 was that the laser II with the same laser parameters was used. In this case, the drilling of the copper foil took place at a rate of 145 holes per second, while the drilling of the epoxy material took place at a rate of 122 holes per second. Therefore, the blind bores were introduced into the laminate at a rate of 65 holes per second.

EXAMPLE 3

The difference from Example 1 was that the blind bores were introduced into the material II. The results were similar.

EXAMPLE 4

The difference from Example 2 was that the blind bores were introduced into the material II. The results were similar.

EXAMPLE 5

The difference from Example 1 was that blind bores with a diameter of 100 $\mu$m were produced. The copper foil was drilled at a rate of 398 holes per second, while the epoxy material was drilled at a rate of 382 holes per second. Therefore, the blind bores were introduced into the laminate at a rate of 183 holes per second.

EXAMPLE 6

The difference from Example 2 was that blind bores with a diameter of 100 $\mu$m were produced. The copper foil was drilled at a rate of 199 holes per second, while the epoxy material was drilled at a rate of 212 holes per second. Therefore, the introduction of the blind bores into the laminate took place at a rate of 99 holes per second.

EXAMPLE 7

The difference from Example 1 was that blind bores with a diameter of 75 $\mu$m were produced. The copper foil was drilled at a rate of 750 holes per second, while the epoxy material was drilled at a rate of 800 holes per second. Therefore, the blind bores were introduced into the laminate at a rate of 300 holes per second.

EXAMPLE 8

The difference from Example 2 was that blind bores with a diameter of 75 µm were produced. The copper foil was drilled at a rate of 370 holes per second, while the epoxy material was drilled at a rate of 400 holes per second. Therefore, the blind bores were introduced into the laminate at a rate of 150 holes per second.

EXAMPLE 9

The difference from Example 1 was that a modified material I, in which approx. 1.5% by weight of the additive I was admixed with the unreinforced epoxy material, was used. The improved absorption of the laser radiation enabled the rate at which the epoxy material was drilled to be increased to 550 holes per second. It was possible to increase the rate of introduction of the blind bores into the laminate by approx. 50%, to approximately 180 holes.

EXAMPLE 10

The difference from Example 9 was that approx. 1.5% by weight of the additive II was admixed with the unreinforced epoxy material. The results were similar.

EXAMPLE 11

The difference from Example 9 was that approx. 1.5% by weight of the additive III was admixed with the unreinforced epoxy material. The increase in the rate at which the epoxy material was drilled was in this case slightly lower.

EXAMPLE 12

The difference from Example 9 was that the laser II with the same laser parameters was used. It was possible to increase the rate at which the epoxy material was drilled to 306 holes per second.

EXAMPLE 13

The difference from Example 9 was that blind bores with a diameter of 100 µm were produced. The rate at which the epoxy material was drilled was 956 holes per second.

EXAMPLE 14

The difference from Example 12 was that blind bores with a diameter of 100 µm were produced. The rate at which the epoxy material was drilled was 531 holes per second.

EXAMPLE 15

The difference from Example 3 was that a modified material II was used, in which the FR4 material which, instead of the standard glass fiber reinforcement was reinforced with approx. 50% by weight of fibers of the additive IV, was formed as the epoxy material. It was possible to increase the rate at which this epoxy material was drilled by a factor of between 2 and 2.5.

Naturally, it is also possible to produce through-holes instead of the blind bores described in Examples 1 to 15. In this case, the lower copper foil is drilled under the same conditions and over the course of the same time as for the drilling of the upper copper foil.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for the laser drilling of laminates which have at least one metal layer and at least one dielectric layer including an organic material, comprising:
   using a frequency-doubled Nd vanadate laser having the following laser parameters,
      pulse width<40 ns,
      pulse frequency≧30 kHz for the metal layer and >20 kHz for the dielectric layer, and
      wavelength=532 nm.

2. The method as claimed in claim 1, wherein a pulse width of <30 ns is used.

3. The method as claimed in claim 1, wherein a focused laser beam with a spot diameter of between 10 µm and 100 µm is used.

4. The method as claimed in claim 3, wherein a focused laser beam with a spot diameter of between 20 µm and 40 µm is used.

5. The method as claimed in claim 1, wherein additives which have good absorptance for laser beams with a wavelength of 532 nm are admixed with the organic material.

6. The method as claimed in claim 5, wherein at least one of an inorganic and an organic pigment, at least one polymer-soluble dye and at least one fibrous filler is used as additive.

7. The method as claimed in claim 6, wherein at least one of an inorganic red pigment and an organic red pigment, and a polymer-soluble red dye is used as additive.

8. The method as claimed in claim 6, wherein between 0.1% by weight and 50% by weight of pigments are admixed with the organic material.

9. The method as claimed in claim 6, wherein between 1% by weight and 2% by weight of pigments are admixed with the organic material.

10. The method as claimed in 5, wherein the organic material, on account of the admixed additives, has an absorptance of at least 50% for the wavelength 532 nm of the laser radiation.

11. The method as claimed in claim 5, wherein the organic material, on account of the admixed additives, has an absorptance of at least 60% for the wavelength 532 nm of the laser radiation.

12. The method as claimed in claim 5, wherein the organic material, on account of the admixed additives, has an absorptance of at least 80% for the wavelength 532 nm of the laser radiation.

13. A device for the laser drilling of laminates which have at least one metal layer and at least one dielectric layer comprising an organic material, comprising:
   a frequency-doubled Nd vanadate laser having the following laser parameters,
      pulse width<40 ns,
      pulse frequency≧30 kHz for the metal layer and ≧20 kHz for the dielectric layer, and
      wavelength=532 nm.

14. The method as claimed in claim 2, wherein a focused laser beam with a spot diameter of between 10 82 m and 100 µm is used.

15. The method as claimed in claim 3, wherein a focused laser beam with a spot diameter of between 20 82 m and 40 µm is used.

16. The method as claimed in claim 7, wherein between 0.1% by weight and 50% by weight of pigments are admixed with the organic material.

17. The method as claimed in 6, wherein the organic material, on account of the admixed additives, has an absorptance of at least 50% for the wavelength 532 nm of the laser radiation.

18. The method as claimed in 7, wherein the organic material, on account of the admixed additives, has an absorptance of at least 50% for the wavelength 532 nm of the laser radiation.

19. The method as claimed in 8, wherein the organic material, on account of the admixed additives, has an absorptance of at least 50% for the wavelength 532 nm of the laser radiation.

20. The method as claimed in 9, wherein the organic material, on account of the admixed additives, has an absorptance of at least 50% for the wavelength 532 nm of the laser radiation.

21. The method as claimed in claim 6, wherein the organic material, on account of the admixed additives, has an absorptance of at least 60% for the wavelength 532 nm of the laser radiation.

22. The method as claimed in claim 7, wherein the organic material, on account of the admixed additives, has an absorptance of at least 60% for the wavelength 532 nm of the laser radiation.

23. The method as claimed in claim 8, wherein the organic material, on account of the admixed additives, has an absorptance of at least 60% for the wavelength 532 nm of the laser radiation.

24. The method as claimed in claim 9, wherein the organic material, on account of the admixed additives, has an absorptance of at least 60% for the wavelength 532 nm of the laser radiation.

25. The method as claimed in claim 6, wherein the organic material, on account of the admixed additives, has an absorptance of at least 80% for the wavelength 532 nm of the laser radiation.

26. The method as claimed in claim 7, wherein the organic material, on account of the admixed additives, has an absorptance of at least 80% for the wavelength 532 nm of the laser radiation.

27. The method as claimed in claim 8, wherein the organic material, on account of the admixed additives, has an absorptance of at least 80% for the wavelength 532 nm of the laser radiation.

28. The method as claimed in claim 9, wherein the organic material, on account of the admixed additives, has an absorptance of at least 80% for the wavelength 532 nm of the laser radiation.

* * * * *